(12) United States Patent
Kobayashi et al.

(10) Patent No.: US 7,839,135 B2
(45) Date of Patent: Nov. 23, 2010

(54) SYSTEM FOR AND METHOD OF ANALYZING PRINTED BOARD CARRYING CHASSIS, PRINTED BOARD CARRYING CHASSIS STRUCTURE, PROGRAM, AND RECORDING MEDIUM

(75) Inventors: Naoki Kobayashi, Tokyo (JP); Ken Morishita, Tokyo (JP); Takashi Harada, Tokyo (JP)

(73) Assignee: NEC Corporation, Tokyo (JP)

( * ) Notice: Subject to any disclaimer, the term of this patent is extended or adjusted under 35 U.S.C. 154(b) by 816 days.

(21) Appl. No.: 11/789,384

(22) Filed: Apr. 24, 2007

(65) Prior Publication Data

US 2007/0288873 A1     Dec. 13, 2007

(30) Foreign Application Priority Data

Apr. 28, 2006   (JP)   .............................. 2006-124880

(51) Int. Cl.
*G01R 31/28* (2006.01)
(52) U.S. Cl. ...................... 324/73.1; 361/778; 361/779
(58) Field of Classification Search ................ 361/778, 361/779; 324/73.1, 334, 459; 716/5
See application file for complete search history.

(56) References Cited

FOREIGN PATENT DOCUMENTS

| JP | 2001-210922 | 8/2001 |
|----|-------------|--------|
| JP | 2002-016391 | 1/2002 |
| JP | 2003-115961 | 4/2003 |
| JP | 2004-158605 | 6/2004 |

*Primary Examiner*—Jeremy C Norris
*Assistant Examiner*—Abiy Getachew
(74) *Attorney, Agent, or Firm*—Scully, Scott, Murphy & Presser, P.C.

(57) ABSTRACT

A structure has a printed board carried by a metal chassis. A printed board carrying chassis analyzing system, a printed board carrying chassis analyzing method, a printed board carrying chassis structure, and a printed board carrying chassis analyzing program are provided to achieve a screw-fastened arrangement for predicting unnecessary radiation frequencies and for reducing unnecessary radiation. An equivalent circuit model including a printed board power and ground plane pair, a pair of confronting surfaces of a printed board and a chassis, and screw-fastened grounding posts is generated and analyzed to predict unnecessary radiation frequencies and unnecessary radiation reductions and to select a screw-fastened arrangement for reducing unnecessary radiation.

31 Claims, 14 Drawing Sheets

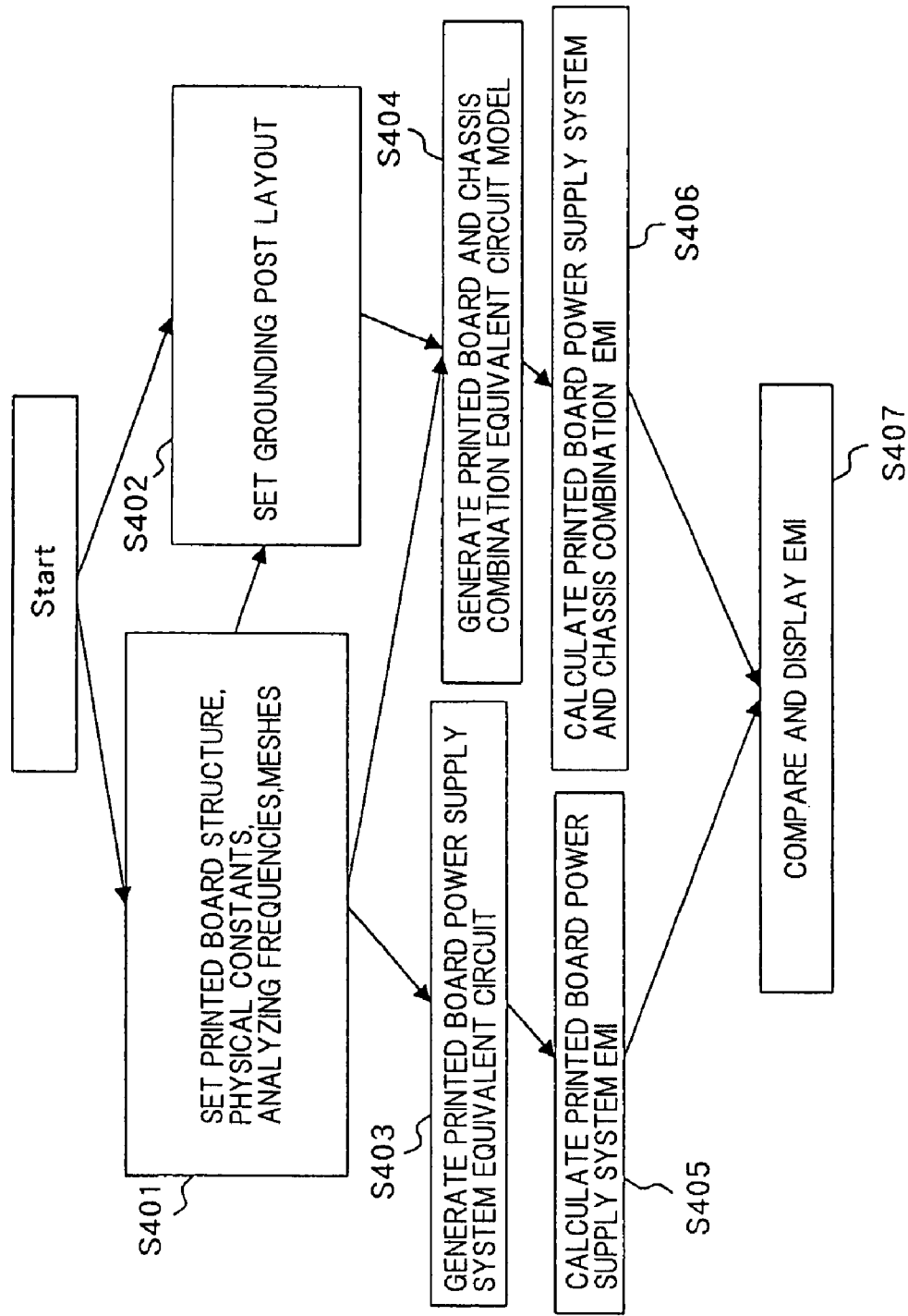

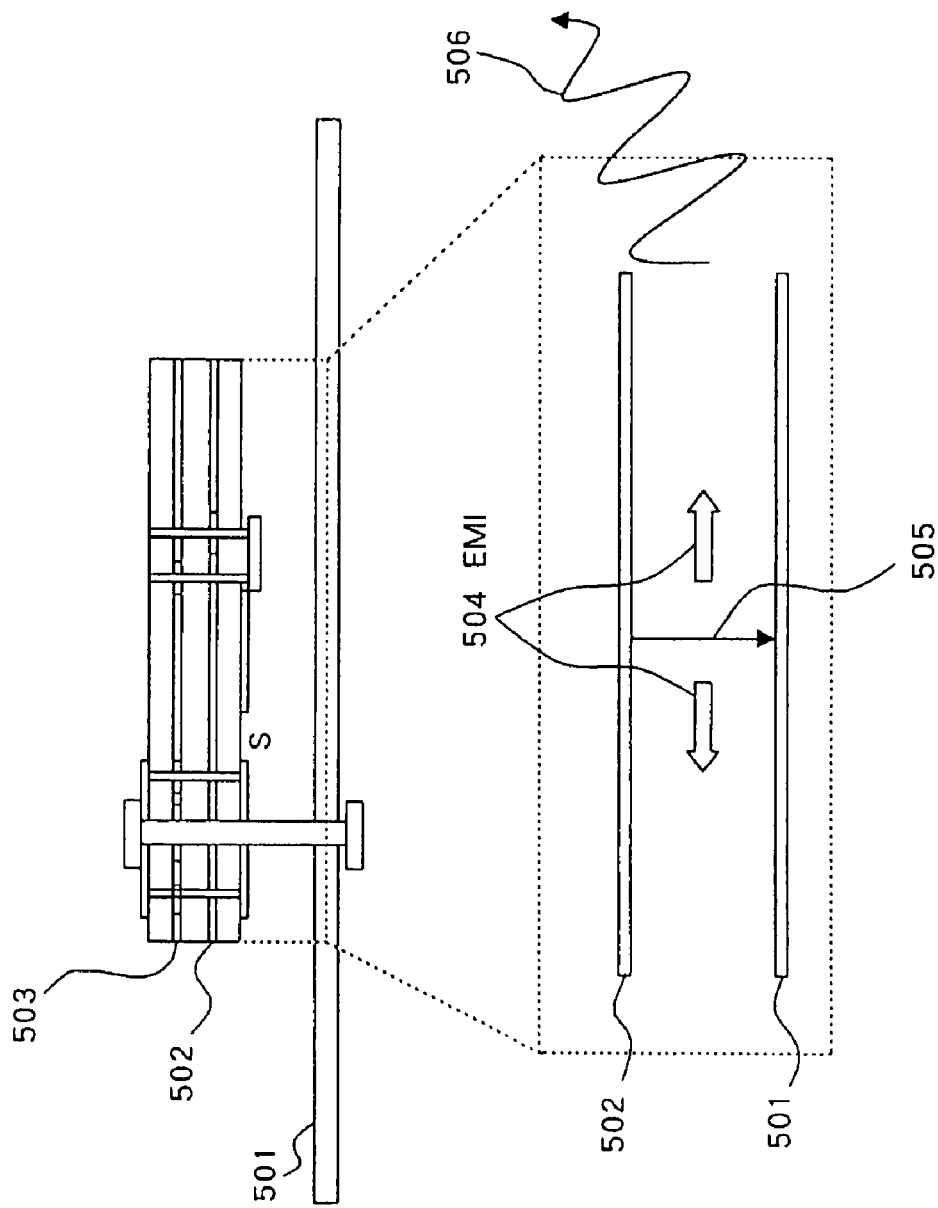

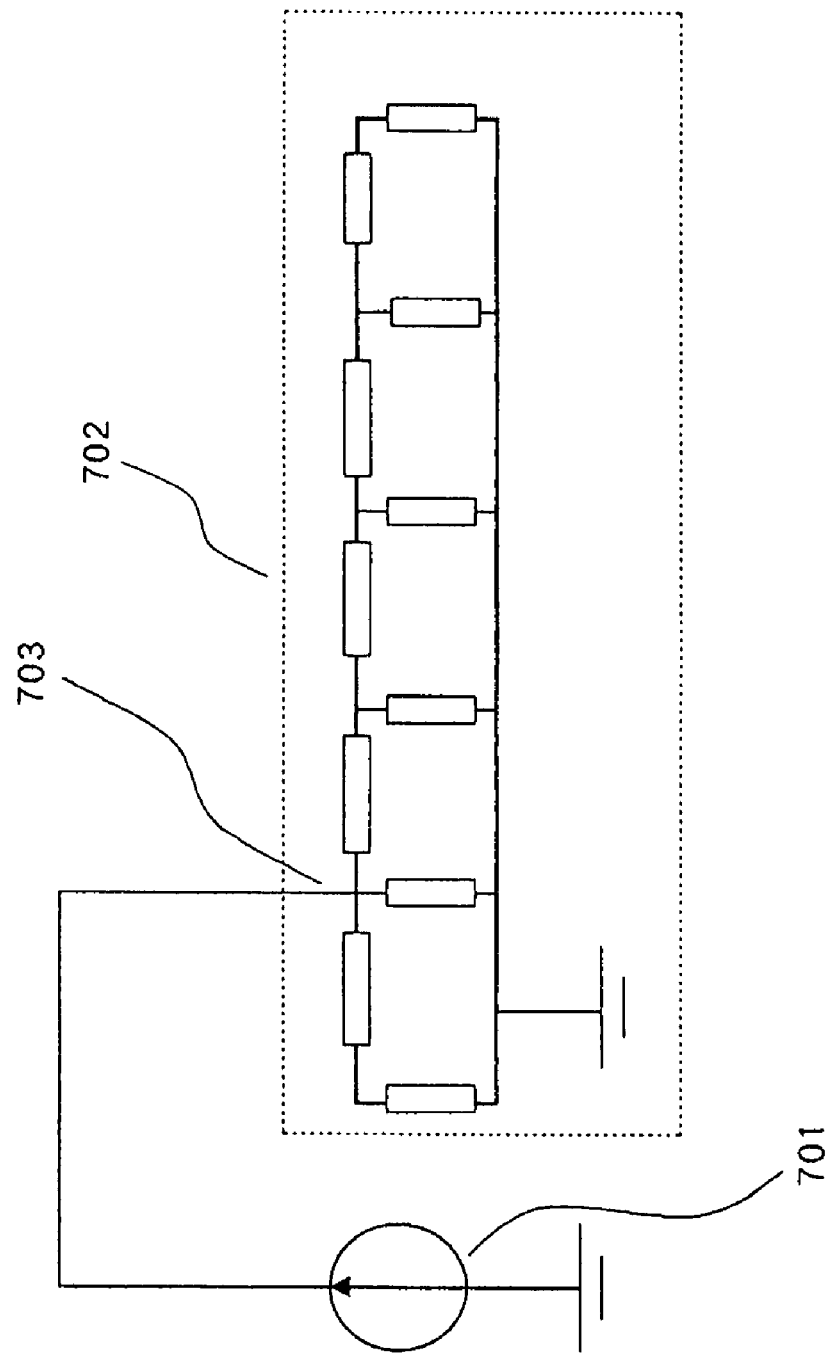

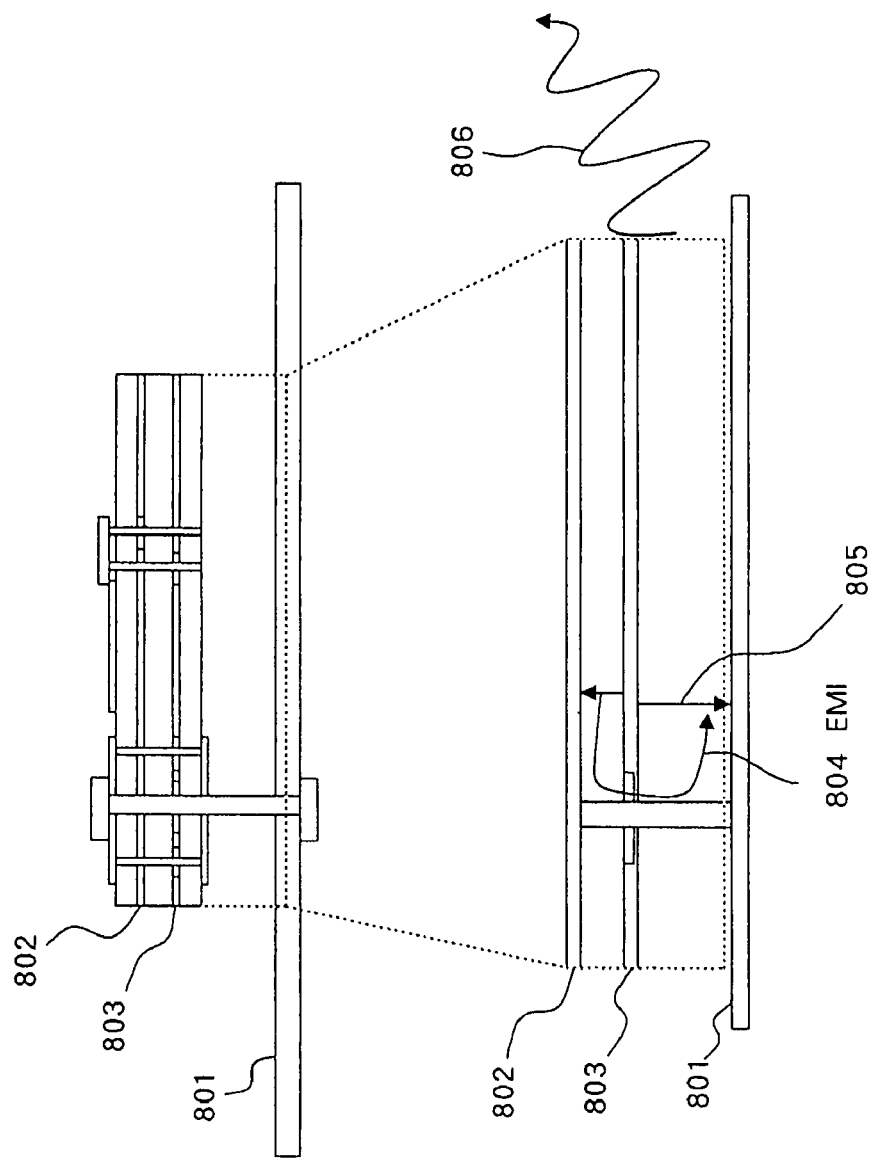

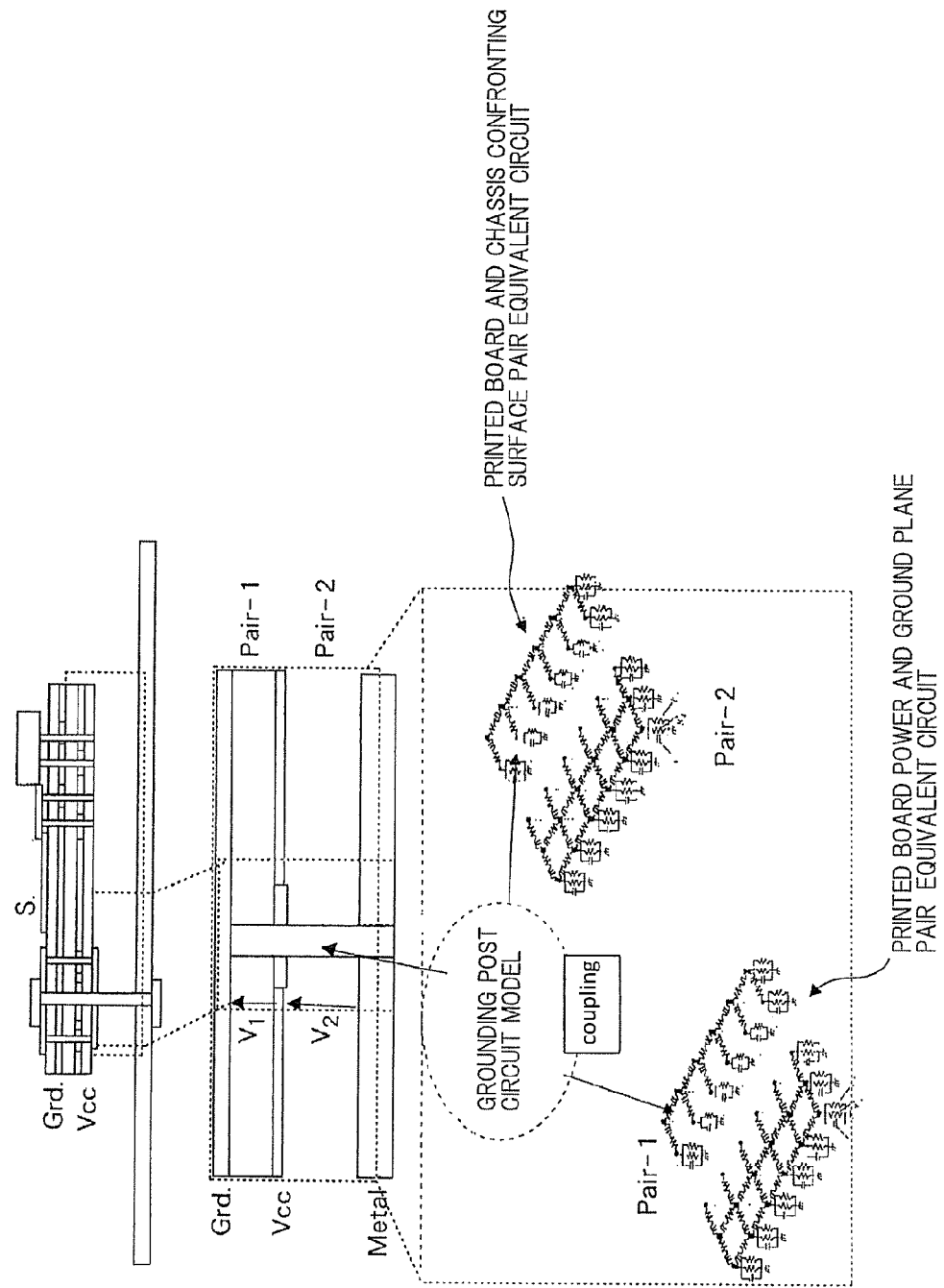

○ : GROUNDING LOCATION

SYSTEM FOR AND METHOD OF ANALYZING PRINTED BOARD CARRYING CHASSIS, PRINTED BOARD CARRYING CHASSIS STRUCTURE, PROGRAM, AND RECORDING MEDIUM

BACKGROUND OF THE INVENTION

1. Field of the Invention

The present invention relates to a structure in which a printed board is carried by a metal chassis, and more particularly to a printed board carrying chassis analyzing system, a printed board carrying chassis analyzing method, a printed board carrying chassis structure, and a printed board carrying chassis analyzing program for providing a screw-fastened arrangement which is effective to predict unnecessary radiation frequencies and reduce unnecessary radiation.

2. Description of the Related Art

As electronic devices have become higher in speed, the problem of unnecessary radiation (hereinafter referred to as EMI (Electro-Magnetic Interference)) from the chassis that carries printed boards thereon has become more noticeable. When a printed board is mounted on a chassis, it is the usual practice to electrically connect the ground plane of the printed board to the chassis with electrically conductive posts (hereinafter referred to as grounding posts) while keeping the ground plane spaced from the chassis by a distance ranging from several millimeters to several centimeters.

As pointed out in JP-A No. 2002-16391, for example, it has heretofore been known in the art that EMI from a chassis structure with a printed board mounted thereon increases when the printed board and the chassis surface confronting the printed board satisfy a particular resonating condition. However, no EMI predicting method has been established yet for a structure in which a grounding post is connected between a printed board and a chassis.

As disclosed in JP-A No. 2001-210922, it has been pointed out in the art that EMI can be reduced by grounding posts placed at the ends of the printed-wiring board and connected to ground patterns as outer frames of layers (signal layers, etc.) other than a ground layer. The disclosed structure is, however, disadvantageous in that the mounting area is relatively small because the ground patterns need to be placed as the outer frames of the signal layers.

JP-A No. 2004-158605 discloses a method of installing a printed-wiring board on a chassis. According to the disclosed method, resistive elements are inserted between power and ground layers of the printed-wiring board to reduce resonance of the power supply system to is thereby reduce the common-mode current flowing through the chassis. However, the disclosed method addresses the reduction of EMI from the power supply system, and is not concerned with the packaging technology for printed boards and chassis.

As described above, though the conventional chassis structure with the printed board mounted thereon can be analyzed for the prediction of the resonant frequency at which EMI is generated, if it has no grounding-posts, there is no method available to predict an EMI-generating resonant frequency for the conventional chassis structure if it has grounding posts. The conventional structure in which ground patterns are placed as the outer frames of the signal layers and are connected to the grounding posts that are connected between the printed-wiring board ends and the chassis is problematic in that the mounting area of the printed-wiring board is limited by the ground patterns added as the outer frames of the signal layers.

SUMMARY OF THE INVENTION

It is a first object of the present invention to provide a method of predicting the frequency at which EMI increases and an increase or reduction in EMI depending on the arrangement of grounding posts with respect to a structure in which a printed board is connected to a chassis by grounding posts.

A second object of the present invention is to provide a structure which is capable of minimizing EMI for use as a structure in which a printed board is connected to a chassis by grounding posts.

According to a first aspect of the present invention, there is provided a printed board carrying chassis analyzing system comprising a means for setting information as to a printed board structure, physical constants, the positions of a noise source and an observation point, analyzing frequencies, and meshes, a means for setting a layout of grounding posts, a means for generating an equivalent circuit model between a printed board and a chassis, a means for calculating resonant characteristics between the printed board and the chassis using the equivalent circuit model, and a means for displaying the resonant characteristics.

According to the first aspect of the present invention, there is provided a printed board carrying chassis analyzing method comprising the steps of setting information as to a printed board structure, physical constants, the positions of a noise source and an observation point, analyzing frequencies, setting meshes, setting a layout of grounding posts, generating an equivalent circuit model between a printed board and a chassis, calculating resonant characteristics between the printed board and the chassis using the equivalent circuit model, and displaying the resonant characteristics.

According to the first aspect of the present invention, there is provided a printed board carrying chassis analyzing program comprising a process of setting information as to a printed board structure, physical constants, the positions of a noise source and an observation point, analyzing frequencies, and meshes, a process of setting a layout of grounding posts, a process of generating an equivalent circuit model between a printed board and a chassis, a process of calculating resonant characteristics between the printed board and the chassis using the equivalent circuit model, and a process of displaying the resonant characteristics.

According to a second aspect of the present invention, there is provided a printed board carrying chassis analyzing system comprising a means for setting information as to a printed board structure, physical constants, the positions of a noise source and an observation point, analyzing frequencies, and meshes, a means for setting a layout of grounding posts, a means for generating a printed board power supply system equivalent circuit, a means for specifying a circuit solver, calculating the printed board power supply system equivalent circuit using the circuit solver, and calculating a power supply system EMI from a calculated value of an end voltage, a means for generating a printed board power supply system and chassis combination equivalent circuit model, a means for calculating the printed board power supply system and chassis combination equivalent circuit model and calculating a power supply system and chassis combination EMI from a calculated value of an end voltage, and a means for comparing the power supply system EMI and the power supply system and chassis combination EMI.

According to the second aspect of the present invention, there is provided a printed board carrying chassis analyzing method comprising the steps of setting information as to a printed board structure, physical constants, the positions of a noise source and an observation point, analyzing frequencies, and meshes, setting a layout of grounding posts, generating a printed board power supply system equivalent circuit, specifying a circuit solver, calculating the printed board power supply system equivalent circuit using the circuit solver, calculating a power supply system EMI from a calculated value of an end voltage, generating a printed board power supply system and chassis combination equivalent circuit model, calculating the printed board power supply system and chassis combination equivalent circuit model and calculating a power supply system and chassis combination EMI from a calculated value of an end voltage, and comparing the power supply system EMI and the power supply system and chassis combination EMI.

According to the second aspect of the present invention, there is provided a printed board carrying chassis analyzing program comprising a process of setting information as to a printed board structure, physical constants, the positions of a noise source and an observation point, analyzing frequencies, and meshes, a process of setting a layout of grounding posts, a process of generating a printed board power supply system equivalent circuit, a process of specifying a circuit solver, a process of calculating the printed board power supply system equivalent circuit using the circuit solver, a process of calculating a power supply system EMI from a calculated value of an end voltage, a process of generating a printed board power supply system and chassis combination equivalent circuit model, a process of calculating the printed board power supply system and chassis combination equivalent circuit model and calculating a power supply system and chassis combination EMI from a calculated value of an end voltage, and a process of comparing the power supply system EMI and the power supply system and chassis combination EMI.

The printed board carrying chassis analyzing system according to the present invention are capable of instantaneously predicting unnecessary radiation frequencies due to the printed board carrying chassis structure and also predicting the layout of grounding posts for reducing unnecessary radiation. The prediction of unnecessary radiation frequencies and a layout of grounding posts is highly important in the field of EMC in order to implement countermeasures against unnecessary radiation in the design stage and also in the field of electric packaging.

BRIEF DESCRIPTION OF THE DRAWINGS

FIG. 4 is a flowchart of a procedure for carrying out a printed board carrying chassis analyzing method according to the second embodiment of the present invention;

FIG. 5 is a schematic view showing a structure in which a pair of confronting surfaces of a printed board and a chassis provides a resonant structure that serves as an EMI generating source;

FIG. 7 is a diagram showing an equivalent circuit of a pair of confronting surfaces of a printed board and a chassis, including a current source representative of a noise source;

FIG. 8 is a schematic view showing a printed board carrying chassis structure in which a power plane is sandwiched between a printed board ground plane and a chassis, and a grounding post extends through a clearance hole defined in the power plane, with noise in a pair of the power plane and the printed board ground plane being propagated through the grounding post to a pair of confronting surfaces of the printed board and the chassis, and serves as the EMI source;

FIG. 9 is a schematic view showing a printed board carrying chassis structure in which a power plane is sandwiched between a printed board ground plane and a chassis, and a grounding post extends through a clearance hole defined in the power plane, with a pair of the power plane and the printed board ground plane, a pair of confronting surfaces of the printed board and the chassis, and the grounding post being represented by equivalent circuits;

The above and other objects, features and advantages of the present invention will become apparent from the following description with reference to the accompanying drawings which illustrate examples of the present invention.

DETAILED DESCRIPTION OF THE PREFERRED EMBODIMENTS

Printed board carrying chassis analyzing systems according to the preferred embodiments of the present invention will be described below.

Figure 1:
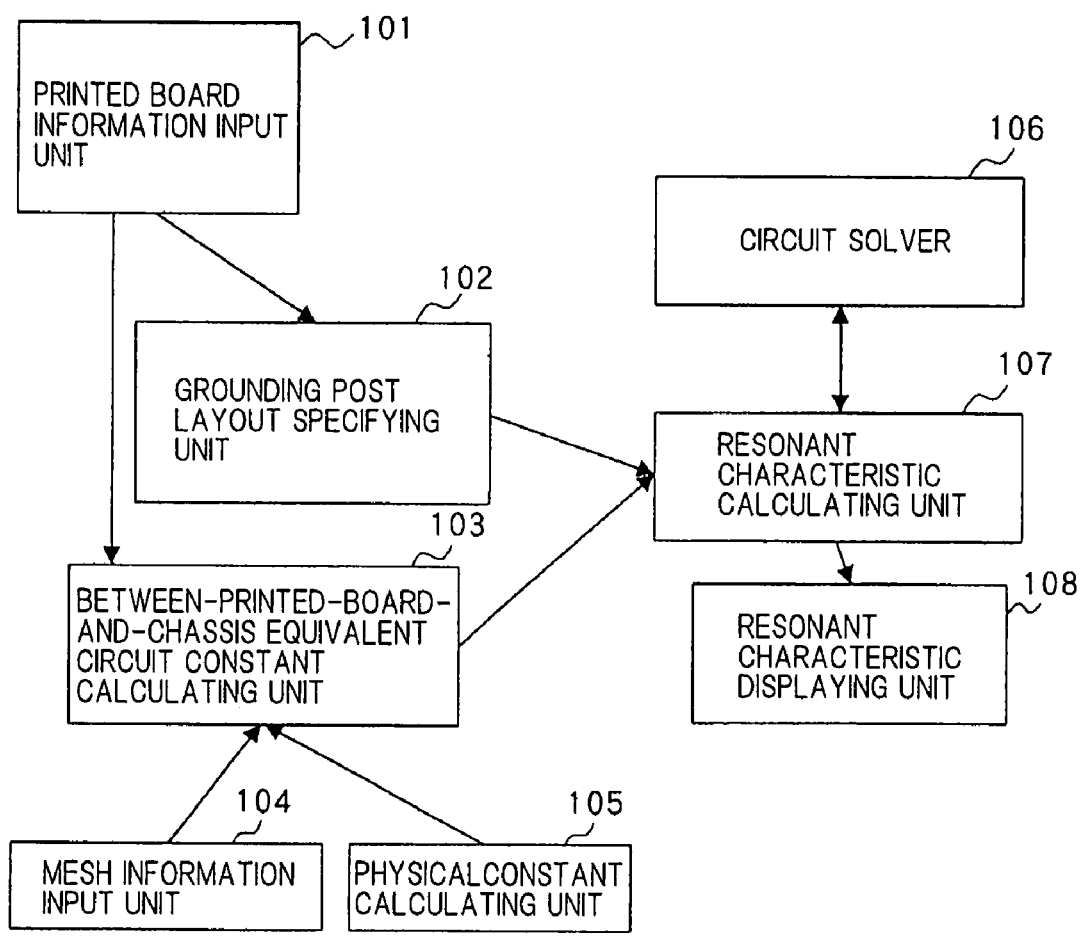
FIG. 1 is a block diagram of a printed board carrying chassis analyzing system according to a first embodiment of the present invention.

FIG. 1 shows in block form a printed board carrying chassis analyzing system according to a first embodiment of the present invention.

As shown in FIG. 1, the printed board carrying chassis analyzing system according to the first embodiment of the present invention comprises printed board information input unit 101, grounding post layout specifying unit 102, between-printed-board-and-chassis equivalent circuit constant calculating unit 103, mesh information input unit 104, physical constant calculating unit 105, circuit solver 106, resonant characteristic calculating unit 107, and resonant characteristic displaying unit 108.

Printed board information input unit 101 is a unit for inputting structural information of a printed board to be mounted on a chassis. Specifically, printed board information input unit 101 has a function to input longitudinal and transverse dimensions, etc., of a printed board.

Grounding post layout specifying unit 102 has a function to specify the number, layout, and circuit constants of grounding posts.

Between-printed-board-and-chassis equivalent circuit constant calculating unit 103 has a function to generate an equivalent circuit by applying a parallel plate model with respect to meshes specified by mesh information input unit 104, incorporate circuit constants specified by grounding post layout specifying unit 102 into the equivalent circuit in regions where a grounding post is present and then calculate overall circuit constants, specify a node closest to a noise source position specified by physical constant input unit 105 as a current source, and specify a node closest to an observation point specified by physical constant input unit 105 as an observation point.

Mesh information input unit 104 is a unit for inputting mesh information to generate an equivalent circuit model between a printed board and a chassis which are held in confronting relation to each other. Specifically, mesh information input unit 104 has a function to specify a mesh number or a mesh interval.

Physical constant input unit 105 is a unit for inputting information as to materials of a printed board and an analyzing frequency. Specifically, physical constant input unit 105 has a function to specify the loss value of the conductor of the printed board, the analyzing frequency range, and the positions of the noise source and the observation point which are required by between-printed-board-and-chassis equivalent circuit constant calculating unit 103.

Resonant characteristic calculating unit 107 has a function to analyze a circuit with circuit solver 106, using information obtained by between-printed-board-and-chassis equivalent circuit constant calculating unit 103, and to calculate a voltage distribution at an observation point in a frequency range specified by physical constant input unit 105.

Resonant characteristic displaying unit 108 has a function to display information obtained by resonant characteristic calculating unit 107 as a graph having a vertical axis that is representative of calculated values of voltages at observation points specified by physical constant input unit 105 and a horizontal axis that is representative of frequencies specified by physical constant input unit 105, and to display a list of voltage peak frequencies as resonant frequencies.

Figure 2:
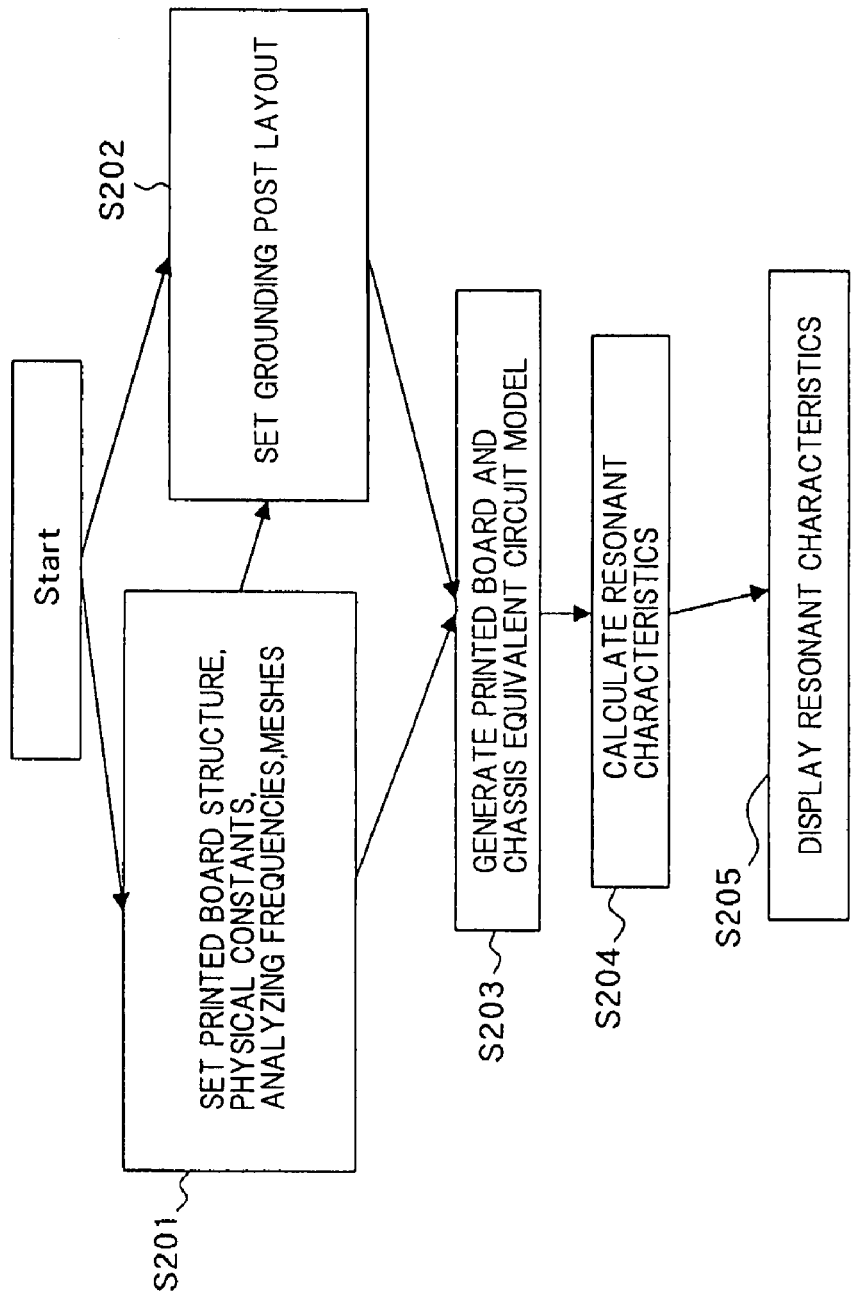
FIG. 2 is a flowchart of a procedure for carrying out a printed board carrying chassis analyzing method according to the first embodiment of the present invention.

FIG. 2 is a flowchart of a procedure for carrying out an analyzing process of the printed board carrying chassis analyzing system according to the first embodiment of the present invention. The analyzing process of the printed board carrying chassis analyzing system according to the first embodiment of the present invention will be described below with reference to FIG. 2.

Structural information of a printed board to be mounted on a chassis is entered into printed board information input unit 101, a physical constant, an analyzing frequency, an unnecessary radiation suppressing frequency, and the positions of a noise source and a voltage observation point are entered into physical constant input unit 105, and information as regards a mesh is entered into mesh information input unit 104 (step S201). Concurrently, a grounding post layout and information regarding circuit constants of grounding posts are entered into grounding post layout specifying unit 102 (step S202).

Then, between-printed-board-and-chassis equivalent circuit constant calculating unit 103 calculates equivalent circuit constants between the printed board and the chassis and generates an equivalent circuit model (step S203). Then, resonant characteristic calculating unit 107 analyzes the equivalent circuit model generated in step S203, with circuit solver 106, and calculates resonant characteristics at the observation point (step S204). Then, resonant characteristic displaying unit 108 displays the resonant characteristics, whereupon the analyzing process is ended (step S205).

Figure 3:
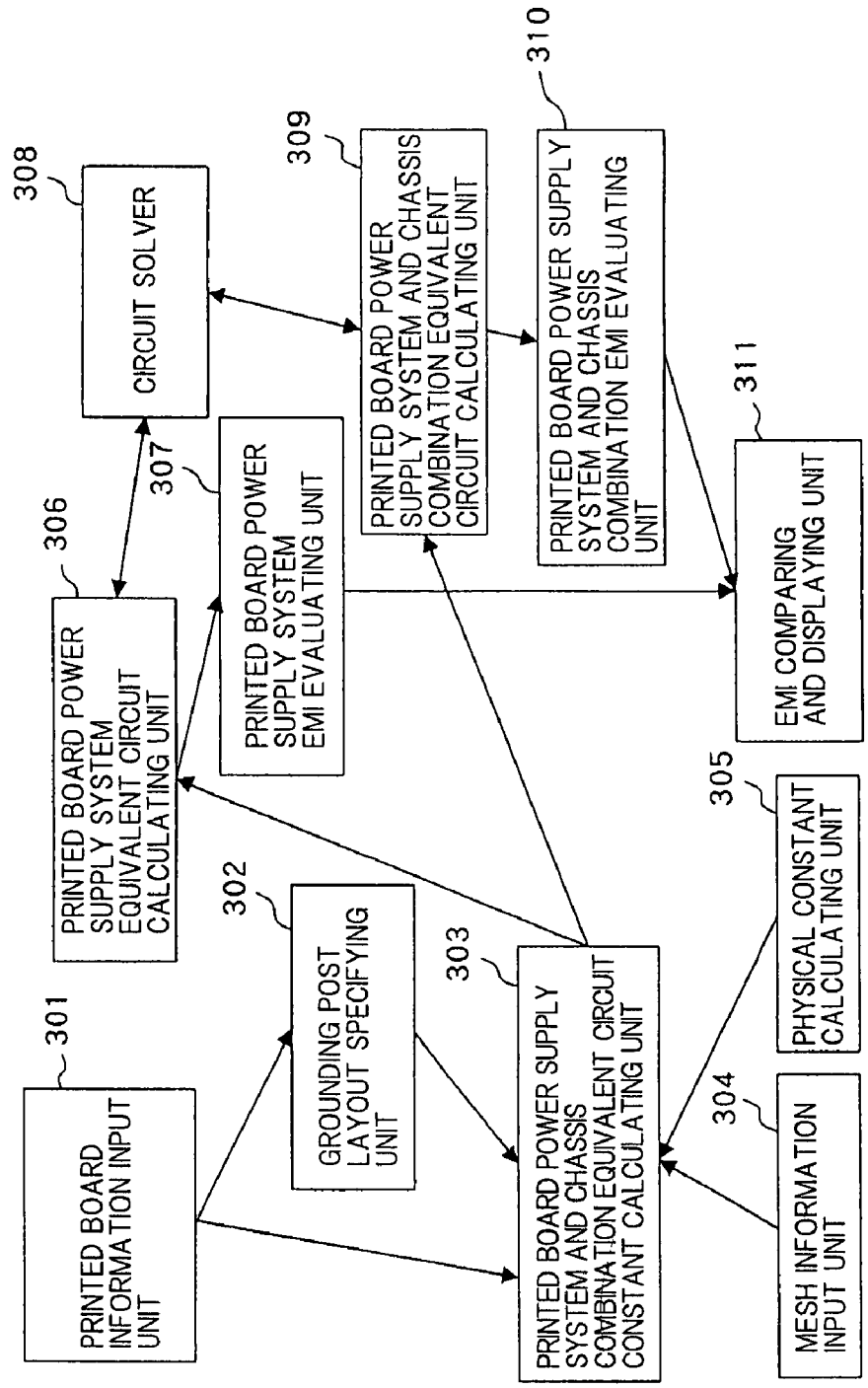
FIG. 3 is a block diagram of a printed board carrying chassis analyzing system according to a second embodiment of the present invention.

FIG. 3 shows in block form a printed board carrying chassis analyzing system according to a second embodiment of the present invention.

As shown in FIG. 3, the printed board carrying chassis analyzing system according to the second embodiment of the present invention comprises printed board information input unit 301, grounding post layout specifying unit 302, printed board power supply system and chassis combination equivalent circuit constant calculating unit 303, mesh information input unit 304, physical constant calculating unit 305, printed board power supply system equivalent circuit calculating unit 306, printed board power supply system EMI evaluating unit 307, circuit solver 308, printed board power supply system and chassis combination equivalent circuit calculating unit 309, printed board power supply system and chassis combination EMI evaluating unit 310, and EMI comparing and displaying unit 311.

Printed board information input unit 301 is a unit for inputting structural information of a printed board to be mounted on a chassis. Specifically, printed board information input unit 301 has a function to input longitudinal and transverse dimensions, etc., of a printed board.

Grounding post layout specifying unit 302 has a function to specify the number, layout, and circuit constants of grounding posts.

Printed board power supply system and chassis combination equivalent circuit constant calculating unit 303 has a function to generate an equivalent circuit by applying two parallel plate models to a printed board power supply system and between a printed board and a chassis with respect to meshes specified by mesh information input unit 304, generate an equivalent circuit of grounding posts which interconnect the two parallel plate models, calculate overall circuit constants, and specify a node closest to the position of a noise source specified by physical constant input unit 305 as a current source.

Mesh information input unit 304 is a unit for inputting mesh information to generate an equivalent circuit model between a printed board and a chassis which are held in confronting relation to each other, and also for inputting mesh information to generate an equivalent circuit model of a printed board power supply system and a ground plane pair. Specifically, mesh information input unit 304 has a function to specify a mesh number or a mesh interval.

Physical constant input unit 305 is a unit for inputting information as to materials of a printed board and an analyzing frequency. Specifically, physical constant input unit 305 has a function to specify the relative permittivity of the dielectric material of the printed board, the loss value of the conductor of the printed board, the analyzing frequency range, and the position of the noise source which is required by printed board power supply system and chassis combination equivalent circuit constant calculating unit 303.

Printed board power supply system equivalent circuit calculating unit 306 has a function to calculate the voltage distribution of a power supply ground plane by using an equivalent circuit model of only a printed board power supply ground plane which is calculated by printed board power supply system and chassis combination equivalent circuit constant calculating unit 303 and also by using circuit solver 308.

Printed board power supply system EMI evaluating unit 307 has a function to calculate an EMI using an end voltage calculated value of the voltage distribution of the power supply ground plane which is calculated by printed board power supply system equivalent circuit calculating unit 306.

Printed board power supply system and chassis combination equivalent circuit calculating unit 309 has a function to calculate the voltage distribution of a power supply ground plane using an equivalent circuit model that is generated from applying parallel plate models between the printed board and the chassis by means of printed board power supply system and chassis combination equivalent circuit constant calculating unit 303 and also by using circuit solver 308.

Printed board power supply system and chassis combination EMI evaluating unit 310 has a function to calculate an EMI using an end voltage calculated value of the voltage distribution of the power supply ground plane which is calculated by printed board power supply system and chassis combination equivalent circuit calculating unit 309.

EMI comparing and displaying unit 311 has a function to compare the printed board power supply system EMI obtained by printed board power supply system EMI evaluating unit 307 and the printed board power supply system and chassis combination EMI obtained by printed board power supply system and chassis combination EMI evaluating unit 310.

FIG. 4 is a flowchart of a procedure for carrying out the analyzing process of the printed board carrying chassis analyzing system according to the second embodiment of the present invention. The analyzing process of the printed board carrying chassis analyzing system according to the second embodiment of the present invention will be described below with reference to FIG. 4.

Structural information of a printed board to be mounted on a chassis is entered into printed board information input unit 301, a physical constant, an analyzing frequency, an unnecessary radiation suppressing frequency, and the position of a noise source are entered into physical constant input unit 305, and information as regards a mesh is entered into mesh information input unit 304 (step S401). Concurrently, a grounding post layout and information as regarding circuit constants of grounding posts are entered into grounding post layout specifying unit 302 (step S402).

Then, printed board power supply system and chassis combination equivalent circuit constant calculating unit 303 generates an equivalent circuit model of only a printed board power supply ground plane, and calculates equivalent circuit constants (step S403).

Then, printed board power supply system equivalent circuit calculating unit 306 calculates a voltage distribution of a power supply ground plane with respect to the equivalent circuit model generated in step S403, using circuit solver 308, and printed board power supply system EMI evaluating unit 307 calculates an EMI using end voltage calculated values of the voltage distribution of the power supply ground plane (step S405).

Then, printed board power supply system and chassis combination equivalent circuit constant calculating unit 303 generates an equivalent circuit by applying parallel plate models between the printed board and the chassis, and calculates equivalent circuit constants (step S404).

Then, printed board power supply system and chassis combination equivalent circuit calculating unit 309 calculates a voltage distribution of a power supply ground plane with respect to the equivalent circuit model generated in step S404, using circuit solver 308, and printed board power supply system and chassis combination EMI evaluating unit 310 calculates the EMI using the end voltage calculated values of the voltage distribution of the power supply ground plane (step S406).

Then, EMI comparing and displaying unit 311 compares and displays the EMI from the printed board power supply ground plane and the EMI from the printed board power supply system and chassis combination, whereupon the analyzing process is ended (step S407).

The theory of the generation and suppression of an EMI from a printed board carrying chassis structure according to the first embodiment of the present invention will be described below.

As shown in FIG. 5, a printed board having printed board power supply 503 and printed board ground 502 is mounted on a chassis having chassis ground 501. With this structure, resonance caused by the structure of confronting surfaces of the printed board and the chassis is responsible for generating EMI 504. EMI 504 is generated perpendicularly to electric line of force 505 between printed board ground 502 and chassis ground 501. The magnitude of EMI 504 increases as leakage electromagnetic wave 506 between the grounds is two-dimensionally propagated to cause the confronting surfaces of the printed board and the chassis to resonate with each other. The resonance between the confronting surfaces of the printed board and the chassis can be analyzed by expressing the structure between the printed board and the chassis as a two-dimensional equivalent circuit.

Figure 6A:
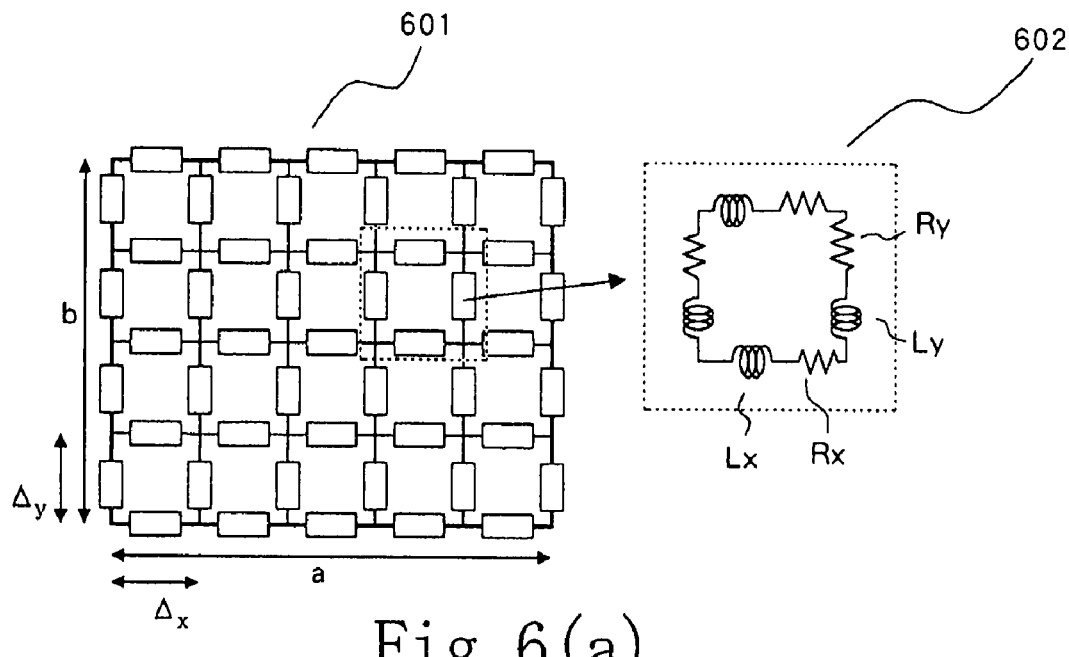
FIGS. 6(a) through 6(c) are diagrams showing equivalent circuits of the pair of confronting surfaces of the printed board and the chassis.
Figure 6B:
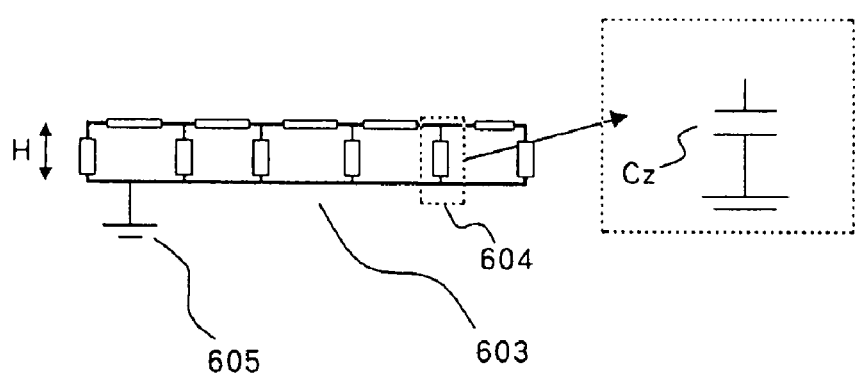
Figure 6C:
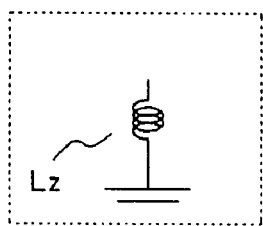

FIGS. 6(a) through 6(c) are diagrams showing equivalent circuits of the confronting surfaces of the printed board and the chassis as they are converted into meshes.

FIG. 6(a) shows equivalent circuit model 601 of an upper surface of the assembly of the printed board and the chassis. The chassis is expressed as a ground conductor, and the printed board as a circuit model. In FIG. 6(a), "a" and "b" represent longitudinal and transverse lengths, respectively, of the printed board, and "$\Delta_x$" and "$\Delta_y$" represent the lengths of two adjacent sides, respectively, of each of the meshes. Each mesh of equivalent circuit model 601 is specifically represented as circuit 602. "Rx" and "Ry" represent respective resistances of the two adjacent sides of each mesh, and "Lx" and "Ly" represent respective inductances of the two adjacent sides of each mesh.

FIG. 6(b) shows equivalent circuit model 603 of the side surface of the assembly of the printed board and the chassis. In FIG. 6(b), "H" represents the distance between the printed board and the chassis. FIG. 6(b) specifically shows ground point 605 of equivalent circuit model 603 and circuit constant 604 on the vertical side of equivalent circuit model 603. "Cz" represents a capacitance at a point free of a grounding post.

FIG. 6(c) shows inductance Lz at a point having a grounding post.

The circuit constants of the two-dimensional equivalent circuit are expressed by the following equations:

$$Lx = \mu H \frac{\Delta_y}{\Delta_x}, \; L_y = \mu_0 H \frac{\Delta_x}{\Delta_y}$$

$$R_x = \sqrt{\frac{\pi f \mu}{\sigma}} \frac{\Delta_x}{\Delta_y}, \; R_y = \sqrt{\frac{\pi f \mu}{\sigma}} \frac{\Delta_x}{\Delta_y}$$

$$C_z = \varepsilon_0 \frac{\Delta_x \Delta_y}{H}$$

σ: Conductivity of the electrical conductor;
$\in_0$: Dielectric constant of the pair of confronting surfaces and the chassis; and
$\mu_0$: Magnetic permeability of the confronting surface pair of the printed board and the chassis.

FIG. 7 shows a model including a noise source placed at an appropriate position between the printed board and the chassis, the noise source being regarded as the current source in the equivalent circuits shown in FIG. 6. In FIG. 7, the reference numeral 701 represents the noise source modeled as the current source between the printed board and the chassis, 702 a sectional representation of the equivalent circuit model between the printed board and the chassis as taken along a plane containing the noise source, and 703 a node corresponding to a portion including the noise source between the printed board and the chassis.

The voltage distribution at each node can be calculated by solving the model shown in FIG. 7 using a circuit solver such as SPICE or the like, and resonant characteristics between the printed board and the chassis can be identified by plotting voltage values at certain observation points against frequencies represented by a horizontal axis.

An examination of the resonant characteristics between the printed board and the chassis indicates that the resonant frequency between the printed board and the chassis can be increased by placing grounding posts at as equal intervals as possible or by placing grounding posts along printed board ends. Therefore, if no EMI is be generated in a certain given frequency range, then grounding posts may be placed at as equal intervals as possible or may be placed along printed board ends in order to avoid resonance in the given frequency range.

The theory of generation and suppression of EMI from a printed board carrying chassis structure according to a second embodiment of the present invention will be described below.

As shown in FIG. 8, a printed board having printed board power supply 803 and printed board ground 802 is mounted on a chassis having chassis ground 801. Printed board power supply 803 is sandwiched between printed board ground 802 and chassis ground 801. A grounding post extends through a hole defined in a power plane of printed board power supply 803. Electric line of force 805 is generated between printed board power supply 803 and chassis ground 801. The structure also generates leakage electromagnetic wave 306 and EMI 804. Peaks of EMI 804 are observed at a resonant frequency caused by the confronting surfaces of printed board power supply 803 and chassis ground 801 and at a resonant frequency caused by the structure of the printed board power and ground plane pair. The resonance of the printed board power and ground plane pair can be suppressed by a layout of grounding posts.

The above phenomenon can be analyzed by coupling, as shown in FIG. 9, a two-dimensional equivalent circuit (Pair-1) of the printed board power and ground plane pair and a two-dimensional equivalent circuit (Pair-2) of the confronting surfaces of the printed board power plane and the chassis, with an equivalent circuit of grounding posts.

The two-dimensional equivalent circuit of the printed board power and ground plane pair and the two-dimensional equivalent circuit of the confronting surfaces of the printed board power plane and the chassis can be determined in the same manner as with the two-dimensional equivalent circuit of the confronting surfaces of the printed board and the chassis shown in FIGS. 6(a) through 6(c). The circuit constants of the two-dimensional equivalent circuit of the printed board power and ground plane pair are expressed by the following equations:

$$L_x = \mu H \frac{\Delta_y}{\Delta_x}, L_y = \mu H \frac{\Delta_x}{\Delta_y}$$

$$R_x = \sqrt{\frac{\pi f \mu}{\sigma}} \frac{\Delta_x}{\Delta_y}, R_y = \sqrt{\frac{\pi f \mu}{\sigma}} \frac{\Delta_x}{\Delta_y}$$

$$C_z = \varepsilon_0 \frac{\Delta_x \Delta_y}{H}, G_z = 2\pi f C_z \tan(\delta)$$

σ: Conductivity of the electrical conductor;
δ: Dielectric loss;
∈: Dielectric constant of the printed board power and ground plane pair;
μ: Magnetic permeability of the printed board power and ground plane pair; and
f: Frequency.

The equivalent circuit of grounding posts which couples the two two-dimensional equivalent circuits can be expressed as an inductance, for example.

It is possible to analyze the printed board power supply system and chassis combination two-dimensional equivalent circuit as described above, with a circuit, a circuit solver such as SPICE or the like, and to calculate EMI from the end voltage values thereof, because the radiant electromagnetic field of a planar antenna structure can be expressed by a modification of existing Maxwell's equations using the end voltage distribution of a plate-like conductor as an equivalent magnetic current source (see S. Ramo et al: Fields and Waves in Communication Electronics, Third Edition, pp. 616). For example, with respect to a chassis structure with a printed board mounted thereon as shown in FIG. 10(b), the end voltage distribution between the ends of a printed board power and ground plane pair and the end voltage distribution between the ends of a chassis and ground plane pair that contribute to the EMI of the chassis structure, can be expressed as respective equivalent magnetic current sources.

Figure 10A:
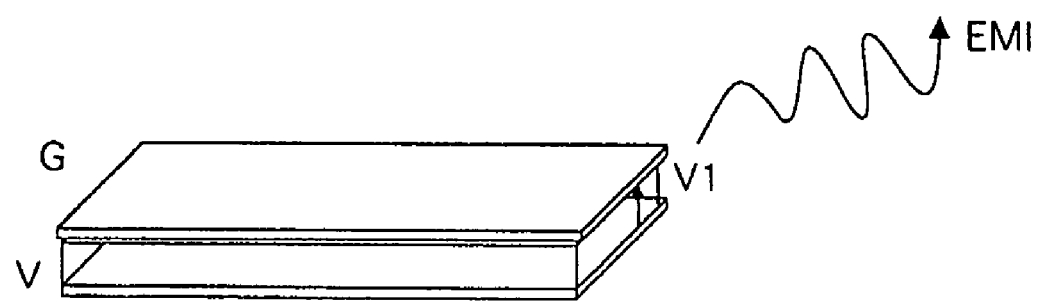
FIGS. 10(a) and 10(b) are views showing the manner in which EMI from a printed board power supply system and a printed board carrying chassis structure can be calculated from voltage values at board ends.
Figure 10B:
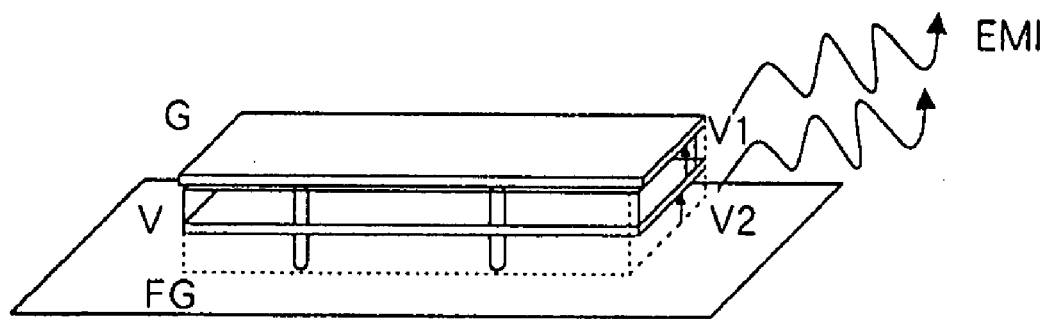

Similarly, with respect to a printed board power supply system free of a chassis as shown in FIG. 10(a), an end voltage distribution between the ends of a printed board power and ground plane pair contributes to EMI of the printed board power supply system, EMI can be calculated from the calculated value of the end voltage of the two-dimensional equivalent circuit (FIG. 9) of the printed board power and ground plane pair. Specifically, EMI may be calculated by the following equations:

$$E = -\frac{1}{\varepsilon} \nabla \times F$$

with $$F = \varepsilon \frac{\exp(-jkr)}{4\pi r} L$$

$$L = \int_{S_1} M_1 \exp(jkr' \cos\psi) dS_1 + \int_{S_2} M_2 \exp(jkr' \cos\psi) dS_2$$

$$M_1 = \frac{V_1}{h_1} \times n, M_2 = \frac{V_2}{h_2} \times n$$

E: Electric field;
∈: Dielectric constant of vacuum;
r: Distance from the EMI generating source;
$S_1$: Boundary along the end of the printed board power and ground plane pair;
$S_2$: Boundary along the end of the pair of confronting surfaces of the printed board power and the chassis;

n: Vector of an outward unit normal to the boundary along the board end;

$V_1$: Voltage along the end of the printed board power and ground plane pair; and $V_2$: Voltage along the end of the pair of confronting surfaces of the printed board and the chassis.

Figure 11A:
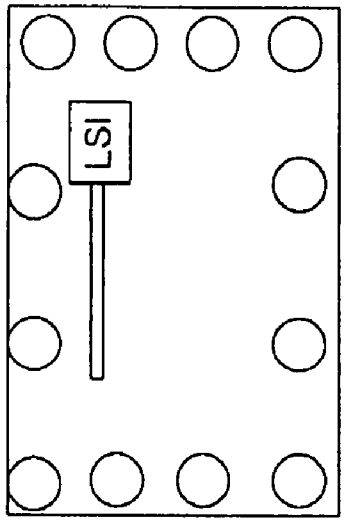
FIGS. 11(a) through 11(d) are views showing patterns of grounding posts which are effective in reducing EMI.
Figure 11B:
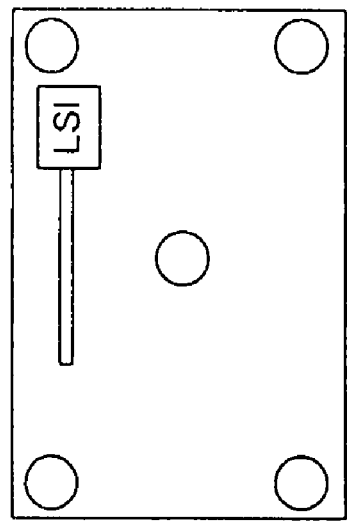

Therefore, it is possible to quantify an increase or decrease in the EMI due to the layout of grounding posts by comparing the EMI calculated using the printed board power supply system and chassis combination two-dimensional equivalent circuit and the EMI calculated using the two-dimensional equivalent circuit of the printed board power and ground plane pair. It has already been known that the EMI from the printed board power and ground plane pair can be greatly reduced by either placing grounding posts as evenly as possible over the printed board (FIG. 11(a)) or by placing ground posts as evenly as possible along the ends of the printed board (FIG. 11(b)) based on the evaluation of the EMI of the printed board power supply system and chassis combination structure according to the above process. For the purpose of causing less resonance between the printed board and the chassis, it is recommended that posts that are adjacent to the grounding posts be spaced from each other by a distance equal to or smaller than one-quarter of the wavelength of an electromagnetic wave which corresponds to the frequency at which no EMI is to be generated.

Figure 11C:
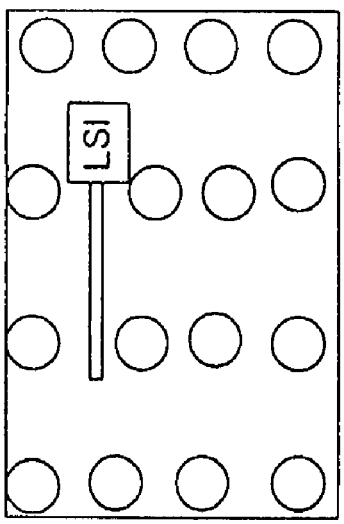
Figure 11D:
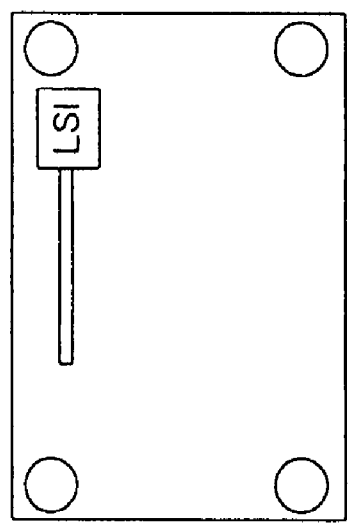

It is also known that four grounding posts placed at respective four corners of the printed board (FIG. 11(c)) and five grounding posts placed at respective four corners and center of the printed board (FIG. 11(d)) are also effective in greatly reducing EMI though these grounding post layouts allow some resonance to be caused between the printed board and the chassis.

Figure 12:
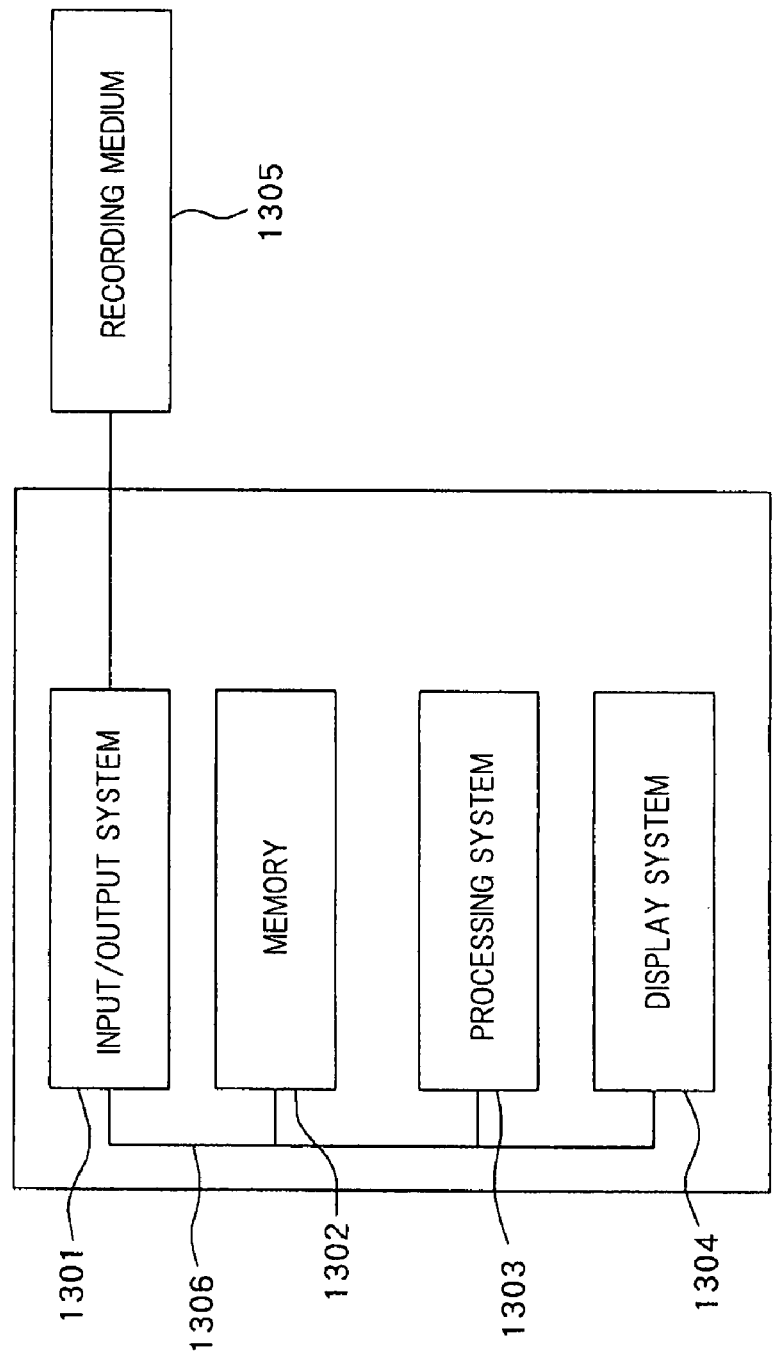
FIG. 12 is a block diagram of a hardware structure of a printed board carrying chassis analyzing system according to the present invention.

A hardware structure of a printed board carrying chassis analyzing system according to the present invention will be described below. FIG. 12 shows in block form a hardware structure of a printed board carrying chassis analyzing system according to the present invention.

As shown in FIG. 12, the printed board carrying chassis analyzing system comprises recording medium 1305 storing therein a printed board carrying chassis analyzing program according to the present invention and a program of SPICE serving as a circuit solver, and an analytical system. The analytical system comprises input/output system 1301 for inputting and outputting data, memory 1302 for storing a program and/or data that have been read, processing system 1303 for controlling the entire printed board carrying chassis analyzing system and performing calculations, and display system 1304 for outputting calculated results. Input/output system 1301, memory 1302, processing system 1303, and display system 1304 are interconnected by bus 1306.

A specific example of the printed board carrying chassis analyzing system according to the second embodiment of the present invention will be described below.

Figure 13A:
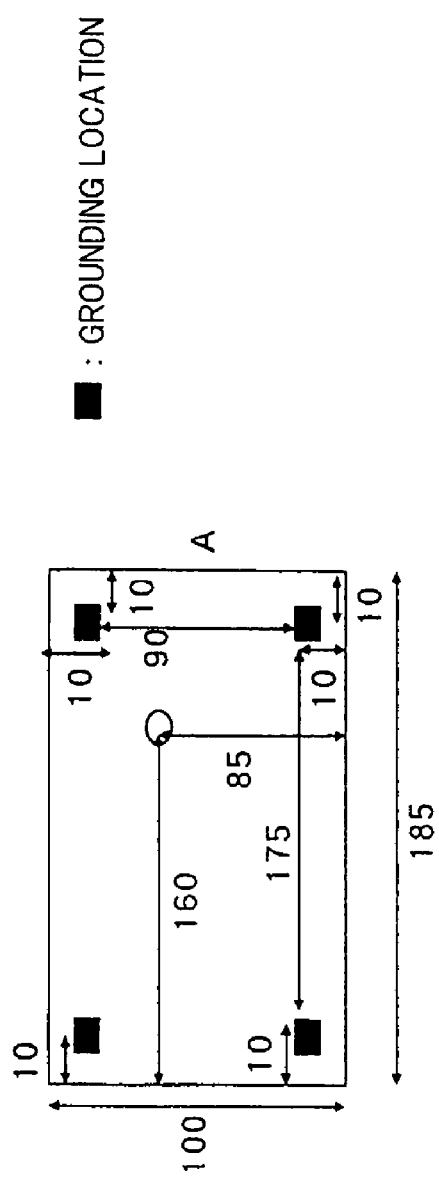
FIGS. 13(a) and 13(b) are plan and cross-sectional views, respectively, showing a specific example of the printed board carrying chassis analyzing system according to the second embodiment of the present invention.
Figure 13B:
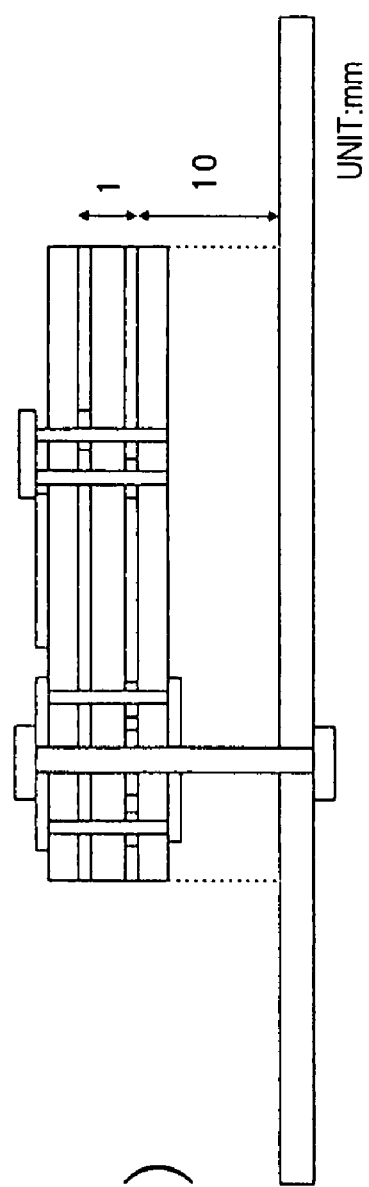

FIGS. 13(a) and 13(b) are plan and cross-sectional views, respectively, showing a specific example of the printed board carrying chassis analyzing system according to the second embodiment of the present invention.

As shown in FIGS. 13(a) and 13(b), specific information about a printed board carrying chassis structure in which a power plane is sandwiched between a printed board ground plane and a chassis, i.e., vertical and horizontal dimensions, the thickness of a power and ground plane pair, the thickness of a pair of confronting surfaces of the printed board and the chassis, the position of a noise source, and a layout of grounding posts, is entered as illustrated numerical values.

Figure 14:
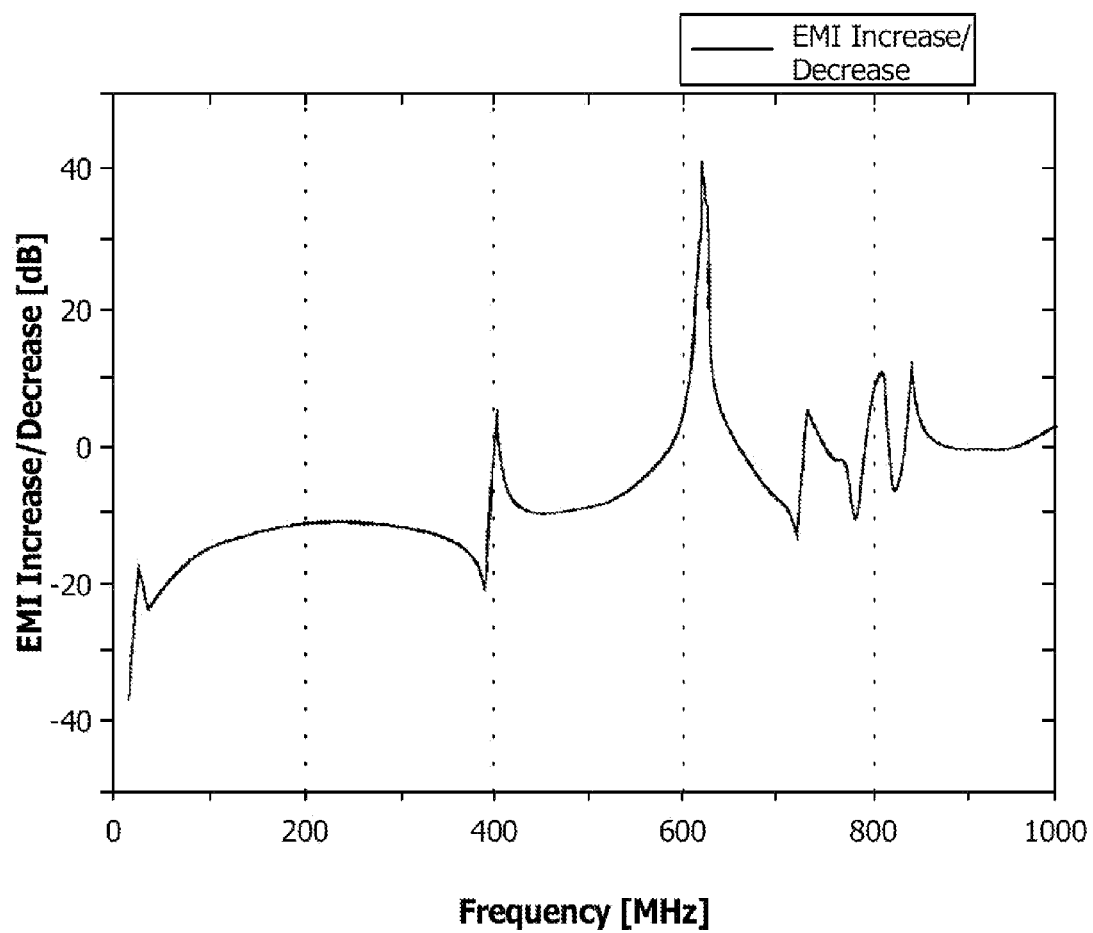
FIG. 14 is a diagram showing analyzed results produced by the specific example of the printed board carrying chassis analyzing system according to the second embodiment of the present invention.

Meshes required for calculations are set to intervals of 5 mm for each power and ground plane pair and for the pair of confronting surfaces of the printed board and the chassis, and analyzing frequencies are set to 100 frequencies from 10 MHz to 1 GHz. The dielectric material of the printed board has a relative permittivity of 4.3 and a dielectric loss of 0.02. Each of the grounding posts has a radius of 2.5 mm. The clearance holes defined in the power plane through which the grounding posts extend have a radius of 3.0 mm. Based on the above input information, the EMI from the printed board power supply system and chassis combination according to the second embodiment is analyzed and displayed as shown in FIG. 14, as compared with the EMI from the printed board power supply system.

According to the present invention, as described above, an increase in the EMI from the printed board power supply system and chassis combination with respect to the EMI from the printed board power supply system can be efficiently calculated.

The printed board carrying chassis analyzing method according to the present invention is carried out when a program is executed by a computer such as a personal computer, a work station, or the like. The program is recorded in a computer-readable recording medium such as a hard disk, a CD-ROM, an MO, a DVD, or the like. The program can be executed by a computer when it is read from the recording medium. The present invention covers a program which is run by a computer to implement the printed board carrying chassis analyzing method, a recording medium for storing such a program, and a printed board carrying chassis structure fabricated according to the printed board carrying chassis analyzing method.

While preferred embodiments of the present invention have been described using specific terms, such description is for illustrative purposes only, and it is to be understood that changes and variations may be made without departing from the sprit or scope of the following claims.

What is claimed is:

1. A printed board carrying chassis analyzing system comprising:

printed board information input means for inputting the longitudinal and transverse dimensions of a printed board to be mounted on a chassis and the distance between confronting surfaces of the printed board and the chassis;

physical constant input means for inputting information as to the loss value of a conductor of the printed board, an analyzing frequency range, and the positions of a noise source and an observation point;

grounding post layout specifying means for inputting information as to the number and layout of grounding posts and circuit constants of grounding posts;

mesh information input means for inputting information as to a mesh number or a mesh interval to generate an equivalent circuit model between the printed board and the chassis which confront each other;

between-printed-board-and-chassis equivalent circuit constant calculating means for generating an equivalent circuit by applying a parallel plate model with respect to meshes specified by said mesh information input means, incorporating circuit constants obtained by said grounding post layout specifying means into said equivalent circuit in regions where a grounding post is present and then calculating overall circuit constants, specifying a node closest to the position of the noise source obtained by said physical constant input means as a current source, and specifying a node closest to the observation point obtained by said physical constant input means as an observation point;

resonant characteristic calculating means for analyzing a circuit with a circuit solver, using information obtained by said between-printed-board-and-chassis equivalent circuit constant calculating means, and calculating a voltage distribution at the observation point in the frequency range obtained by said physical constant input unit; and resonant characteristic displaying means for displaying information obtained by said resonant characteristic calculating unit means as a graph having a vertical axis that is representative of calculated values of voltages at observation points obtained by said physical constant input means and a horizontal axis that is representative of frequencies obtained by said physical constant calculating unit, and displaying voltage peaks at resonant frequencies.

2. The printed board carrying chassis analyzing system according to claim 1, wherein an equivalent circuit of a confronting surface pair of the printed board and the chassis is expressed by:

$$Lx = \mu H \frac{\Delta_y}{\Delta_x}, L_y = \mu_0 H \frac{\Delta_x}{\Delta_y}$$

$$R_x = \sqrt{\frac{\pi f \mu}{\sigma}} \frac{\Delta_x}{\Delta_y}, R_y = \sqrt{\frac{\pi f \mu}{\sigma}} \frac{\Delta_y}{\Delta_x}$$

$$C_z = \varepsilon_0 \frac{\Delta_x \Delta_y}{H}$$

σ: Conductivity of the electrical conductor;

$\in_0$: Dielectric constant of the pair of confronting surfaces of the printed board and the chassis; and $\mu_0$: Magnetic permeability of the pair of confronting surfaces of the printed board and the chassis.

3. A printed board carrying chassis analyzing system comprising:

printed board information input means for inputting the longitudinal and transverse dimensions of a printed board to be mounted on a chassis, the thickness of a power and ground plane pair, and the distance between confronting surfaces of the printed board and the chassis; physical constant input means for inputting information as regards the relative permittivity of a dielectric material of the printed board, the loss value of a conductor of the printed board, an analyzing frequency range, and the position of a noise source;

grounding post layout specifying means for inputting information as to the number and layout of grounding posts and circuit constants of grounding posts;

mesh information input means for inputting information as regards a mesh number or a mesh interval to generate an equivalent circuit model of a pair of confronting surfaces of the printed board and the chassis, and a mesh number or a mesh interval to generate an equivalent circuit model of a printed board power and ground plane pair;

printed board power supply system and chassis combination equivalent circuit constant calculating means for generating an equivalent circuit by applying two parallel plate models to a printed board power and ground plane pair and to a pair of confronting surfaces of the printed board and the chassis, with respect to meshes obtained by said mesh information input means, generating an equivalent circuit of grounding posts which interconnect the two parallel plate models, calculating overall circuit constants, and specifying a node closest to the position of the noise source obtained by said physical constant input means as a current source;

printed board power supply system equivalent circuit calculating means for calculating a voltage distribution of the printed board power and ground plane pair with a circuit solver, using the equivalent circuit model of only the printed board power and ground plane pair which is generated by said printed board power supply system and chassis combination equivalent circuit constant calculating means;

printed board power supply system and chassis combination equivalent circuit calculating means for calculating an equivalent circuit model of said printed board power supply system and chassis combination equivalent circuit constant calculating means, using a circuit solver;

printed board power supply system EMI evaluating means for calculating an EMI using an end voltage calculated value of the voltage of the printed board power, and ground plane pair which is calculated by said printed board power supply system equivalent circuit calculating means;

printed board power supply system and chassis combination EMI evaluating means for calculating EMI using end voltage calculated values of the printed board power and ground plane pair, and a end voltage calculated values of the pair of confronting surfaces of the printed board and the chassis, which are obtained from said printed board power supply system and chassis combination equivalent circuit calculating means; and means for comparing and displaying a printed board power supply system EMI calculated by said printed board power supply system EMI evaluating means and a printed board power supply system and chassis combination EMI calculated by said printed board power supply system and chassis combination EMI evaluating means.

4. The printed board carrying chassis analyzing system according to claim 3, wherein an equivalent circuit of a pair of confronting surfaces of the printed board and the chassis is expressed by:

$$Lx = \mu H \frac{\Delta_y}{\Delta_x}, L_y = \mu_0 H \frac{\Delta_x}{\Delta_y}$$

$$R_x = \sqrt{\frac{\pi f \mu}{\sigma}} \frac{\Delta_x}{\Delta_y}, R_y = \sqrt{\frac{\pi f \mu}{\sigma}} \frac{\Delta_y}{\Delta_x}$$

$$C_z = \varepsilon_0 \frac{\Delta_x \Delta_y}{H}$$

σ: Conductivity of the electrical conductor;

$\in_0$: Dielectric constant of the pair of confronting surfaces of the printed board and the chassis; and $\mu_0$: Magnetic permeability of the pair of confronting surfaces of the printed board and the chassis; and wherein an equivalent circuit of the printed board power and ground plane pair is expressed by:

$$Lx = \mu H \frac{\Delta_y}{\Delta_x}, L_y = \mu H \frac{\Delta_x}{\Delta_y}$$

-continued $$R_x = \sqrt{\frac{\pi f \mu}{\sigma}} \frac{\Delta_x}{\Delta_y}, R_y = \sqrt{\frac{\pi f \mu}{\sigma}} \frac{\Delta_x}{\Delta_y}$$

$$C_z = \varepsilon_0 \frac{\Delta_x \Delta_y}{H}, G_z = 2\pi f C_z \tan(\delta)$$

σ: Conductivity of the electrical conductor;
δ: Dielectric loss;
∈: Dielectric constant of the printed board power and ground plane pair;
μ: Magnetic permeability of the printed board power and ground plane pair; and
f: Frequency.

5. The printed board carrying chassis analyzing system according to claim 3, wherein the evaluation of EMI from a printed board power supply and chassis combination structure is expressed by:

$$E = -\frac{1}{\varepsilon} \nabla \times F$$

with $$F = \varepsilon \frac{\exp(-jkr)}{4\pi r} L$$

$$L = \int_{S_1} M_1 \exp(jkr' \cos\psi) dS_1 + \int_{S_2} M_2 \exp(jkr' \cos\psi) dS_2$$

$$M_1 = \frac{V_1}{h_1} \times n, M_2 = \frac{V_2}{h_2} \times n$$

E: Electric field;
∈: Dielectric constant of a vacuum;
r: Distance from the EMI generating source;
$S_1$: Boundary along the end of the printed board power and ground plane pair;
$S_2$: Boundary along the end of the pair of confronting surfaces of the printed board power and the chassis;
n: Vector of an outward unit normal to the boundary along the ended of the board;
$V_1$: Voltage along the end of the printed board power and ground plane pair; and
$V_2$: Voltage along the end of the pair of confronting surfaces of the printed board and the chassis.

6. A printed board carrying chassis analyzing method comprising the steps of:
(a) obtaining the longitudinal and transverse dimensions of a printed board to be mounted on a chassis and the distance between confronting surfaces of the printed board and the chassis;
(b) obtaining information as to the loss value of a conductor of the printed board, an analyzing frequency range, and the positions of a noise source and an observation point;
(c) obtaining information as to the number and layout of grounding posts and circuit constants of grounding posts;
(d) obtaining information as to a mesh number or a mesh interval to generate an equivalent circuit model between the printed board and the chassis which confront each other;
(e) generating an equivalent circuit by applying a parallel plate model with respect to meshes obtained in said step (d), incorporating circuit constants obtained in said step (c) into said equivalent circuit in regions where a grounding post is present and then calculating overall circuit constants, specifying a node closest to the position of the noise source obtained in said step (b) as a current source, and specifying a node closest to the observation point obtained in said step (b) as an observation point;
(f) analyzing a circuit with a circuit solver, using information obtained in said step (e), and calculating a voltage distribution at the observation point in the frequency range obtained in said step (b); and
(g) displaying information obtained in said step (f) as a graph having a vertical axis that is representative of calculated values of voltages at observation points obtained in said step (b) and a horizontal axis that is representative of frequencies obtained in said step (b), and displaying voltage peaks at resonant frequencies.

7. A printed board carrying chassis structure having grounding posts disposed in a layout designed to shift the resonant frequency of a pair of confronting surfaces of a printed board and a chassis out of a frequency range in which no EMI is to be generated, using a printed board carrying chassis analyzing method according to claim 6.

8. The printed board carrying chassis structure according to claim 7, wherein adjacent ones of the grounding posts mounted on said pair of confronting surfaces of the printed board and the chassis are spaced from each other by a distance equal to or smaller than one-quarter of a wavelength which corresponds to a frequency at which no EMI is to be generated.

9. The printed board carrying chassis structure according to claim 7, wherein adjacent ones of the grounding posts mounted on said pair of confronting surfaces of the printed board and the chassis are spaced from each other along an end of the printed board by a distance equal to or smaller than one-quarter of a wavelength which corresponds to a frequency at which no EMI is to be generated.

10. The printed board carrying chassis structure according to claim 7, wherein a printed board power plane is sandwiched between a printed board ground plane and the chassis, and said grounding posts extend through clearance holes defined in the printed board power plane, and wherein said grounding posts are disposed in a layout designed to suppress EMI from a printed board power supply system in the frequency range in which no EMI is to be generated, using results predicted from the printed board carrying chassis.

11. The printed board carrying chassis structure according to claim 7, wherein a printed board power plane is sandwiched between a printed board ground plane and the chassis, and said grounding posts extend through clearance holes defined in the printed board power plane, and wherein said grounding posts are disposed respectively at four corners of said printed board power plane.

12. The printed board carrying chassis structure according to claim 7, wherein a printed board power plane is sandwiched between a printed board ground plane and the chassis, and said grounding posts extend through clearance holes defined in the printed board power plane, and wherein said grounding posts are disposed along ends of said printed board power plane.

13. The printed board carrying chassis structure according to claim 12, wherein adjacent ones of the grounding posts mounted along ends of said printed boards are spaced from each other by a distance equal to or smaller than one-quarter of a wavelength which corresponds to a frequency at which no EMI is to be generated.

14. The printed board carrying chassis structure according to claim 7, wherein a printed board power plane is sandwiched between a printed board ground plane and the chassis, and said grounding posts extend through clearance holes defined in the printed board power plane, and wherein adjacent ones of the grounding posts are mounted on the printed board power plane and spaced from each other by a distance equal to or smaller than one-quarter of a wavelength which corresponds to a frequency at which no EMI is to be generated.

15. A recording medium storing a program for enabling a computer to carry out a method according to claim 14.

16. The printed board carrying chassis structure according to claim 7, wherein a printed board power plane is sandwiched between a printed board ground plane and the chassis, and said grounding posts extend through clearance holes defined in the printed board power plane, and wherein said grounding posts are disposed respectively at four corners and near the center of said printed board power plane.

17. The printed board carrying chassis analyzing method according to claim 6, wherein an equivalent circuit of a confronting surface pair of the printed board and the chassis is expressed by:

$$Lx = \mu H \frac{\Delta_y}{\Delta_x}, L_y = \mu_0 H \frac{\Delta_x}{\Delta_y}$$

$$R_x = \sqrt{\frac{\pi f \mu}{\sigma}} \frac{\Delta_x}{\Delta_y}, R_y = \sqrt{\frac{\pi f \mu}{\sigma}} \frac{\Delta_y}{\Delta_x}$$

$$C_z = \varepsilon_0 \frac{\Delta_x \Delta_y}{H}$$

σ: Conductivity of the electrical conductor;
$\varepsilon_0$: Dielectric constant of the pair of confronting surfaces of the printed board and the chassis; and
$\mu_0$: Magnetic permeability of the confronting surface pair of the printed board and the chassis.

18. A recording medium storing a program for enabling a computer to carry out a method according to claim 6.

19. A printed board carrying chassis analyzing method comprising the steps of:
   (a) obtaining the longitudinal and transverse dimensions of a printed board to be mounted on a chassis, the thickness of a power and ground plane pair, and the distance between confronting surfaces of the printed board and the chassis;
   (b) obtaining information as to the relative permittivity of a dielectric material of the printed board, the loss value of a conductor of the printed board, an analyzing frequency range, and the position of a noise source;
   (c) obtaining information as to the number and layout of grounding posts and circuit constants of grounding posts;
   (d) obtaining information as to a mesh number or a mesh interval to generate an equivalent circuit model of a pair of confronting surfaces of the printed board and the chassis, and a mesh number or a mesh interval to generate an equivalent circuit model of a printed board power and ground plane pair;
   (e) generating an equivalent circuit by applying two parallel plate models to a printed board power and ground plane pair and a confronting surface pair of the printed board and the chassis, with respect to meshes obtained in said step (d), generating an equivalent circuit of grounding posts which interconnect the two parallel plate models, calculating overall circuit constants, and specifying a node closest to the position of the noise source obtained in said step (b) as a current source;
   (f) calculating a voltage distribution of the printed board power and ground plane pair with a circuit solver, using the equivalent circuit model of only the printed board power and ground plane pair which is generated in said step (e);
   (g) calculating an equivalent circuit model obtained in said step (e) using a circuit solver;
   (h) calculating EMI using an end voltage calculated value of the voltage of the printed board power and ground plane pair which is calculated in said step (f);
   (i) calculating EMI using an end voltage calculated value of the printed board power and ground plane pair and an end voltage calculated value of the pair of confronting surfaces of the printed board and the chassis, which are obtained in said step (g); and
   (j) comparing and displaying a printed board power supply system EMI obtained in said step (h) and a printed board power supply system and chassis combination EMI obtained in said step (i).

20. A printed board carrying chassis structure having grounding posts disposed in a layout designed to shift the resonant frequency of a pair of confronting surfaces of a printed board and a chassis out of a frequency range in which no EMI is to be generated, using a printed board carrying chassis analyzing method according to claim 19.

21. The printed board carrying chassis structure according to claim 20, wherein adjacent ones of the grounding posts mounted on said confronting surface pair of the printed board and the chassis are spaced from each other by a distance equal to or smaller than one-quarter of a wavelength which corresponds to a frequency at which no EMI is to be generated.

22. The printed board carrying chassis structure according to claim 20, wherein adjacent ones of the grounding posts mounted on said pair of confronting surfaces of the printed board and the chassis are spaced from each other along an end of the printed board by a distance equal to or smaller than one-quarter of a wavelength which corresponds to a frequency at which no EMI is to be generated.

23. The printed board carrying chassis structure according to claim 20, wherein a printed board power plane is sandwiched between a printed board ground plane and the chassis, and said grounding posts extend through clearance holes defined in the printed board power plane, and wherein said grounding posts are disposed respectively at four corners of said printed board power plane.

24. The printed board carrying chassis structure according to claim 20, wherein a printed board power plane is sandwiched between a printed board ground plane and the chassis, and said grounding posts extend through clearance holes defined in the printed board power plane, and wherein said grounding posts are disposed along ends of said printed board power plane.

25. The printed board carrying chassis structure according to claim 24, wherein adjacent ones of the grounding posts mounted along ends of said printed boards are spaced from each other by a distance equal to or smaller than one-quarter of a wavelength which corresponds to a frequency at which no EMI is to be generated.

26. A recording medium storing a program for enabling a computer to carry out a method according to claim 25.

27. The printed board carrying chassis structure according to claim 20, wherein a printed board power plane is sandwiched between a printed board ground plane and the chassis, and said grounding posts extend through clearance holes defined in the printed board power plane, and wherein adjacent ones of the grounding posts are mounted on the printed board power plane and spaced from each other by a distance equal to or smaller than one-quarter of a wavelength which corresponds to a frequency at which no EMI is to be generated.

28. A printed board carrying chassis structure according to claim 20, wherein a printed board power plane is sandwiched between a printed board ground plane and the chassis, and said grounding posts extend through clearance holes defined in the printed board power plane, and wherein said grounding posts are disposed respectively at four corners and near the center of said printed board power plane.

29. The printed board carrying chassis analyzing method according to claim 19, wherein an equivalent circuit of a pair of confronting surfaces pair of the printed board and the chassis is expressed by:

$$Lx = \mu H \frac{\Delta_y}{\Delta_x}, L_y = \mu_0 H \frac{\Delta_x}{\Delta_y}$$

$$R_x = \sqrt{\frac{\pi f \mu}{\sigma}} \frac{\Delta_x}{\Delta_y}, R_y = \sqrt{\frac{\pi f \mu}{\sigma}} \frac{\Delta_y}{\Delta_x}$$

$$C_z = \varepsilon_0 \frac{\Delta_x \Delta_y}{H}$$

σ: Conductivity of the electrical conductor;
∈₀: Dielectric constant of the pair of confronting surfaces of the printed board and the chassis; and
μ₀: Magnetic permeability of the pair of confronting surfaces of the printed board and the chassis, and
wherein an equivalent circuit of the printed board power and ground plane pair is expressed by:

$$Lx = \mu H \frac{\Delta_y}{\Delta_x}, L_y = \mu H \frac{\Delta_x}{\Delta_y}$$

$$R_x = \sqrt{\frac{\pi f \mu}{\sigma}} \frac{\Delta_x}{\Delta_y}, R_y = \sqrt{\frac{\pi f \mu}{\sigma}} \frac{\Delta_y}{\Delta_x}$$

$$C_z = \varepsilon_0 \frac{\Delta_x \Delta_y}{H}, G_z = 2\pi f C_z \tan(\delta)$$

σ: Dielectric loss;
∈: Dielectric loss;
μ: Dielectric constant of the printed board power and ground plane pair;
μ: Magnetic permeability of the printed board power and ground plane pair; and
f: Frequency.

30. The printed board carrying chassis analyzing method according to claim 19, wherein the evaluation of EMI from a printed board power supply and chassis combination structure is expressed by:

$$E = -\frac{1}{\varepsilon} \nabla \times F \text{ with}$$

$$F = \varepsilon \frac{\exp(-jkr)}{4\pi r} L$$

$$L = \int_{S_1} M_1 \exp(jkr' \cos\psi) dS_1 + \int_{S_2} M_2 \exp(jkr' \cos\psi) dS_2$$

$$M_1 = \frac{V_1}{h_1} \times n, M_2 = \frac{V_2}{h_2} \times n$$

E: Electric field;
∈: Dielectric constant of a vacuum;
r: Distance from the EMI generating source;
$S_1$: Boundary along the end of the printed board power and ground plane pair;
$S_2$: Boundary along the end of the pair of confronting surfaces of the printed board power and the chassis;
n: Vector of an outward unit normal to the boundary along the ended of the board;
$V_1$: Voltage along the end of the printed board power and ground plane pair; and
$V_2$: Voltage along the end of the pair of confronting surfaces of the printed board and the chassis.

31. A recording medium storing a program for enabling a computer to carry out a method according to claim 19.

* * * * *